US 012320831B2

(12) United States Patent
Sim et al.

(10) Patent No.: US 12,320,831 B2
(45) Date of Patent: Jun. 3, 2025

(54) MODE STIRRING DEVICE

(71) Applicant: ELECTRONICS AND TELECOMMUNICATIONS RESEARCH INSTITUTE, Daejeon (KR)

(72) Inventors: Dong-Uk Sim, Daejeon (KR); Sangil Kwak, Daejeon (KR); Seung Keun Park, Daejeon (KR); Hyeyeon Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 212 days.

(21) Appl. No.: 18/107,883

(22) Filed: Feb. 9, 2023

(65) Prior Publication Data
US 2023/0420823 A1    Dec. 28, 2023

(30) Foreign Application Priority Data

Jun. 23, 2022 (KR) .................. 10-2022-0077118
Oct. 28, 2022 (KR) .................. 10-2022-0141717

(51) Int. Cl.
*G01R 29/08*   (2006.01)
*H01Q 1/12*    (2006.01)
*H02K 7/075*   (2006.01)

(52) U.S. Cl.
CPC ..... *G01R 29/0814* (2013.01); *G01R 29/0878* (2013.01); *H01Q 1/125* (2013.01); *H02K 7/075* (2013.01)

(58) Field of Classification Search
CPC ........... H01Q 1/125; G01R 29/0814; G01R 29/0878; G01R 29/10; G01R 29/105; H02K 7/075
See application file for complete search history.

(56) References Cited

U.S. PATENT DOCUMENTS

| 5,300,939 A * | 4/1994 | Maeda ............ G01R 29/10 343/703 |
| 5,530,412 A * | 6/1996 | Goldblum ........ G01R 29/0821 324/633 |
| 7,995,968 B2 | 8/2011 | Sotoudeh |

(Continued)

FOREIGN PATENT DOCUMENTS

| JP | H05-90884 U | 12/1993 |
| KR | 10-2018-0093176 A | 8/2018 |
| WO | 2005/003795 A1 | 1/2005 |

OTHER PUBLICATIONS

CTIA, "Test Plan for Wireless Large-Form-Factor Device Over-the-Air Performance", Feb. 2019.

*Primary Examiner* — Jason M Crawford
(74) *Attorney, Agent, or Firm* — LRK PATENT LAW FIRM

(57) ABSTRACT

Provided is a mode stirring device. The mode stirring device includes a transmission antenna configured to output a wireless signal to measure wireless performance in an electromagnetic (EM) wave reverberation chamber, an antenna connection bar having one end coupled to a lower end of the transmission antenna, a crankshaft connected to another end of the antenna connection bar, and a motor configured to change a position of the transmission antenna by rotating the crankshaft.

5 Claims, 7 Drawing Sheets

(56) References Cited

U.S. PATENT DOCUMENTS

| | | | | |
|---|---|---|---|---|
| 8,412,112 B2* | 4/2013 | Foegelle | ............ | H04B 17/3911 |
| | | | | 455/67.11 |
| 9,356,342 B1* | 5/2016 | Whetten | ................ | H01Q 1/50 |
| 9,482,708 B2* | 11/2016 | Alhorr | ................ | G01R 27/32 |
| 10,520,534 B1* | 12/2019 | Rowell | ................ | G01R 29/10 |
| 10,598,711 B2 | 3/2020 | Sim et al. | | |
| 10,928,432 B2 | 2/2021 | Sim et al. | | |
| 11,789,056 B2* | 10/2023 | Midori | ................ | H01Q 15/18 |
| | | | | 324/629 |
| 2002/0160717 A1* | 10/2002 | Persson | ............. | G01R 29/0821 |
| | | | | 455/67.11 |
| 2007/0176607 A1* | 8/2007 | McCormick | ....... | G01R 29/0835 |
| | | | | 324/627 |
| 2008/0129615 A1* | 6/2008 | Breit | ................ | H04W 56/00 |
| | | | | 343/703 |
| 2010/0134364 A1* | 6/2010 | Okazaki | ............. | G01R 29/0871 |
| | | | | 343/703 |
| 2010/0233969 A1* | 9/2010 | Frolik | ................ | H04B 17/0082 |
| | | | | 455/67.14 |
| 2011/0122032 A1* | 5/2011 | Sakata | ................ | H04B 17/364 |
| | | | | 343/703 |
| 2013/0093447 A1* | 4/2013 | Nickel | ................ | G01R 29/10 |
| | | | | 324/750.16 |
| 2015/0149108 A1* | 5/2015 | Cozza | ................ | G01N 27/00 |
| | | | | 702/124 |
| 2019/0103926 A1* | 4/2019 | Chen | ................ | H04B 17/102 |
| 2020/0096547 A1* | 3/2020 | Orozco Valdes | .. | G01R 29/0892 |
| 2020/0096554 A1* | 3/2020 | Orozco Valdes | .. | G01R 31/2884 |
| 2020/0177289 A1* | 6/2020 | Maruo | ................ | G01R 29/105 |
| 2021/0318369 A1* | 10/2021 | Rehammar | ............... | H01Q 3/02 |
| 2022/0140497 A1* | 5/2022 | Orozco Valdes | ........ | H01Q 1/02 |
| | | | | 342/361 |
| 2023/0168286 A1* | 6/2023 | Midori | ............... | G01R 29/0821 |
| | | | | 324/612 |
| 2023/0420823 A1* | 12/2023 | Sim | ........................ | H02K 7/075 |

\* cited by examiner

MODE STIRRING DEVICE

CROSS-REFERENCE TO RELATED APPLICATIONS

This application claims the benefit of Korean Patent Application No. 10-2022-0077118 filed on Jun. 23, 2022, and Korean Patent Application No. 10-2022-0141717 filed on Oct. 28, 2022, in the Korean Intellectual Property Office, the entire disclosure of which is incorporated herein by reference for all purposes.

BACKGROUND

1. Field of the Invention

One or more embodiments relates to a mode stirring device used in an electromagnetic (EM) wave reverberation chamber and changing an output position of a wireless signal for measuring wireless performance.

2. Description of Related Art

The over-the-air (OTA) performance of a wireless terminal such as a smartphone is an important indicator for users and terminal manufacturers. Currently, in the terminal development stage, the OTA performance of such a wireless terminal is measured in an electromagnetic (EM) wave reverberation chamber that may reproduce a wireless channel.

However, in the conventional EM wave reverberation chamber, since deviations of power transmission function values at various positions in a test volume may be large, there may be the problem that the OTA performance measurement values of a device under test may vary depending on a type, a size, and a test location of the device under test.

In addition, when measuring wireless performance, in the case of deviations of measured values at very adjacent frequencies are large, a measured value representing a channel may not be defined and the reliability of the test environment is greatly reduced.

Therefore, there is a need for a method that may reduce deviations of spatial uniformity values at adjacent measured frequencies within a frequency band of interest.

SUMMARY

Embodiments provide a mode stirring device that changes a position of a transmission antenna by rotating a crankshaft coupled with the transmission antenna, so spatial uniformity characteristics may be improved in a frequency band of interest in a test volume of the electromagnetic (EM) wave reverberation chamber, and deviations of spatial uniformity values in adjacent measured frequencies may be reduced.

According to an aspect, there is provided a mode stirring device including a transmission antenna configured to output a wireless signal to measure wireless performance in an EM wave reverberation chamber, an antenna connection bar having one end coupled to a lower end of the transmission antenna, a crankshaft connected to another end of the antenna connection bar, and a motor configured to change a position of the transmission antenna by rotating the crankshaft.

The mode stirring device may further include a weight coupled to one surface of the lower end of the transmission antenna and configured to prevent the transmission antenna from rotating around the antenna connection bar in a process of changing the position of the transmission antenna by rotating the crankshaft.

The mode stirring device may further include a support configured to fix the mode stirring device to the EM wave reverberation chamber so that a position of the mode stirring device does not change in a process of changing the position of the transmission antenna by rotating the crankshaft.

The crankshaft may include a circular disk connected to the motor, an eccentric hole formed at a center of the circular disk, and an eccentric shaft fixable to the eccentric hole and connected to the antenna connection bar.

The antenna connection bar may be configured to control a change range of a position where the transmission antenna outputs the wireless signal by changing a length.

The antenna connection bar may be configured to control a change range of a position where the transmission antenna outputs the wireless signal by changing a connection angle with the crankshaft.

Additional aspects of embodiments will be set forth in part in the description which follows and, in part, will be apparent from the description, or may be learned by practice of the disclosure.

According to embodiments, by providing a mode stirring device that changes a position of a transmission antenna by rotating a crankshaft coupled with the transmission antenna, spatial uniformity characteristics may be improved in a frequency band of interest in a test volume of the EM wave reverberation chamber and deviations of spatial uniformity values in adjacent measured frequencies may be reduced.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Hereinafter, embodiments will be described in detail with reference to the accompanying drawings. A method of measuring a wireless channel characteristic according to an embodiment may be performed by a system of measuring a wireless channel characteristic.

Figure 1:
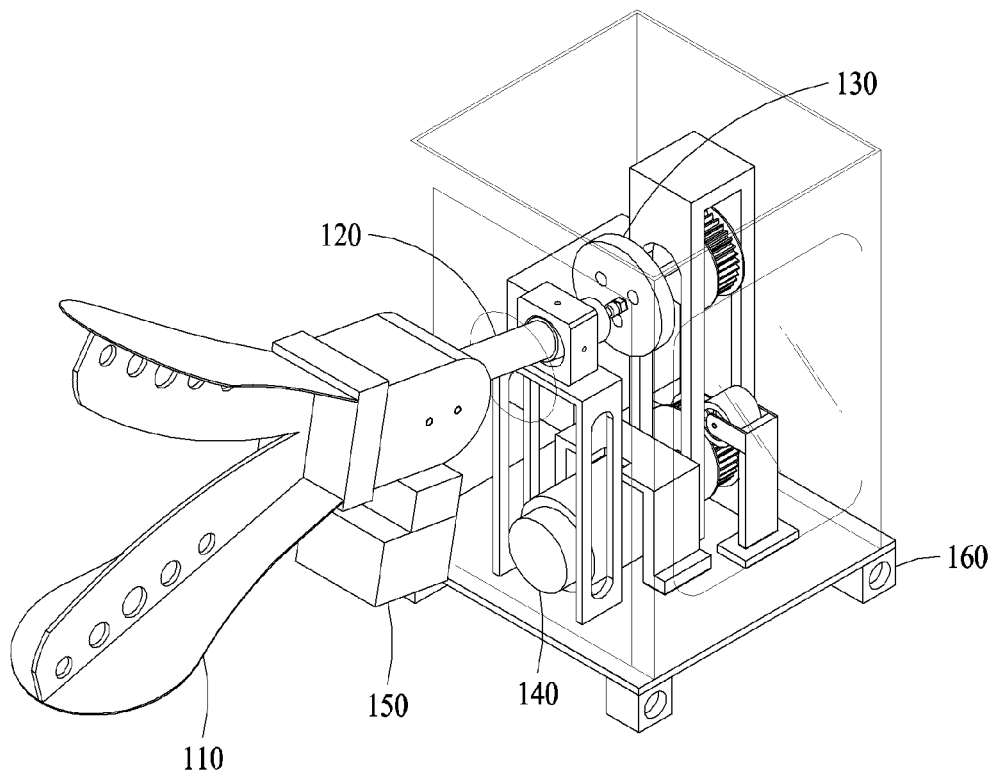
FIG. 1 is a diagram illustrating a mode stirring device according to an embodiment.

FIG. 1 is a diagram illustrating a mode stirring device according to an embodiment.

The mode stirring device according to an embodiment may include a transmission antenna 110, an antenna connection bar 120, a crankshaft 130, and a motor 140.

The transmission antenna 110 may output a wireless signal for measuring wireless performance in an electromagnetic (EM) wave reverberation chamber. For example, the transmission antenna 110 may be a horn antenna, as shown in FIG. 1, or an antenna of another shape.

One end of the antenna connection bar 120 may be coupled to a lower end of the transmission antenna 110 and the other end may be connected to the crankshaft 130.

At this time, the antenna connection bar 120 may control a change range of a position where the transmission antenna 110 outputs a wireless signal. For example, the antenna connection bar 120 may be formed in a flexible bar shape. In addition, a length of the antenna connection bar 120 may be set to be shorter than a default length or may be set to be longer than the default length in a process of wireless performance measurement, and then the wireless performance measurement may be performed. In addition, the mode stirring device may include the antenna connection bars 120 having different lengths and being replaceable. In addition, the mode stirring device may perform the wireless performance measurement while replacing the antenna connection bars 120 having different lengths.

In addition, the antenna connection bar 120 may change a connection angle with the crankshaft 130 and control a change range of the position where the transmission antenna 110 outputs the wireless signal. For example, an angle of the antenna connection bar 120 may be set to be smaller than a default angle or may be set to be larger than the default angle in a process of the wireless performance measurement, and then the wireless performance measurement may be performed. At this time, when a vertical angle of the crankshaft 130 is defined as 0 degrees (°) and the crankshaft 130 is defined as 90°, an angle of the antenna connection bar 120 may be 0° to less than 90°.

The crankshaft 130 may include a circular disk connected to the motor 140, an eccentric hole formed at a center of the circular disk, and an eccentric shaft fixable to the eccentric hole and connected to the antenna connection bar 120.

The motor 140 may rotate the crankshaft 130 and change the position where the transmission antenna 110 outputs the wireless signal. At this time, the transmission antenna 110 may rotate conically according to a rotation of the crankshaft 130.

When the polarization direction of the transmission antenna 110 needs to be fixed, the mode stirring device may further include a weight 150. At this time, the weight 150 may be coupled to one surface of the lower end of the transmission antenna 110 as shown in FIG. 1. In addition, the weight 150 may prevent the transmission antenna 110 from rotating around the antenna connection bar 120 in a process of changing a position of the transmission antenna 110 according to the rotation of the crankshaft 130.

When the polarization direction of the transmission antenna 110 does not need to be fixed, the weight 150 may be removed from the mode stirring device. At this time, the transmission antenna 110 may rotate slightly around the antenna connection bar 120 in the process of changing the position of the transmission antenna 110 according to the rotation of the crankshaft 130.

A support 160 may fix the mode stirring device to the EM wave reverberation chamber so that a position of the mode stirring device does not change in the process of changing the position of the transmission antenna 110 according to the rotation of the crankshaft 130. For example, when an inner surface of the EM wave reverberation chamber is made of a metal material, the support 160 may be a magnetic support made of a magnetic material and a metal material. Also, the support 160 may be an adsorption support.

The present disclosure improves the mode stirring device that changes the position of the transmission antenna by rotating the crankshaft coupled with the transmission antenna, thereby improving spatial uniformity characteristics in a frequency band of interest in a test volume of the EM wave reverberation chamber and reducing deviation of spatial uniformity values in adjacent measured frequencies.

Figure 2:
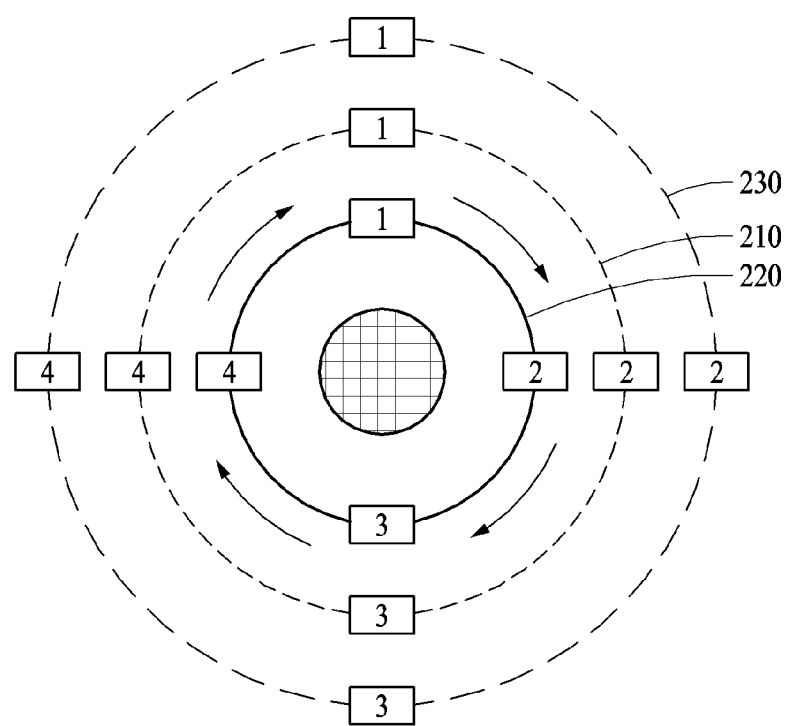
FIG. 2 is a diagram illustrating an example of a mode stirring device operation according to an embodiment.

FIG. 2 is a diagram illustrating an example of a mode stirring device operation according to an embodiment.

In FIG. 2, a grid-shaped circle at the center is the mode stirring device and a quadrangle indicates an opening surface of the transmission antenna 110 connected to the mode stirring device. Also, numbers 1, 2, 3, and 4 may be positions where the transmission antenna 110 moves.

In the case of a length or an angle of the antenna connection bar 12 is a default, when the mode stirring device rotates the crankshaft 130, the transmission antenna 110 may sequentially move from position 1 to position 2, position 3, and position 4 along the path 210. Considering the side view and three-dimensional (3D) drawing, this rotation method may be described as conical rotation.

In addition, in the case of the length of the antenna connection bar 12 is shorter than the default length or the angle is smaller than the default angle, when the mode stirring device rotates the crankshaft 130, the transmission antenna 110 may sequentially move from position 1 to position 2, position 3, and position 4 according to a path 220 having a diameter shorter than that of the path 210.

In addition, in the case of the length of the antenna connection bar 12 is longer than the default length or the angle is greater than the default angle, when the mode stirring device rotates the crankshaft 130, the transmission antenna 110 may sequentially move from position 1 to position 2, position 3, and position 4 according to a path 230 having a diameter longer than that of the path 210.

As shown in FIG. 2, the mode stirring device according to the present disclosure may generate more EM wave modes in the EM wave reverberation chamber by variously changing the position of the transmission antenna 110.

When more EM wave modes occur in the EM wave reverberation chamber, the level of spatial uniformity decreases in the frequency band of interest within the test volume, thereby reducing measurement uncertainty, providing an environment in which the wireless performance of a device under test may be more accurately measured and evaluated.

In addition, when more EM wave modes are generated in the EM wave reverberation chamber, since the EM wave mode density increases in the frequency band of interest, deviations of spatial uniformity values in adjacent measured frequencies may be reduced.

Figure 3:
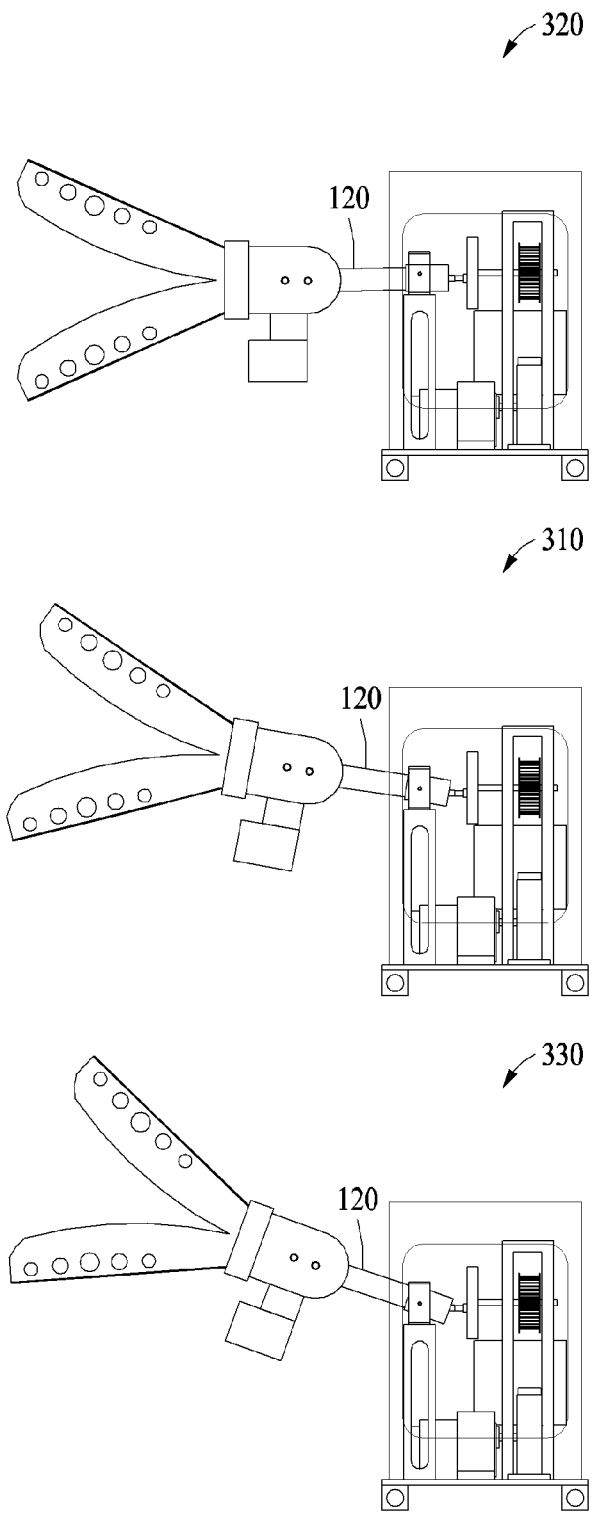
FIG. 3 is a diagram illustrating an example of a connection angle change of an antenna connection bar of a mode stirring device according to an embodiment.

FIG. 3 is a diagram illustrating an example of a connection angle change of an antenna connection bar of a mode stirring device according to an embodiment.

In operation 310, the mode stirring device rotates the crankshaft 130 in a state where the angle of the antenna connection bar 120 is a default angle, so that the transmission antenna 110 may sequentially move along the path 210.

In operation 320, the mode stirring device rotates the crankshaft 130 in a state where the angle of the antenna connection bar 120 is changed to an angle smaller than the default angle, so that the transmission antenna 110 may sequentially move along the path 220.

In operation 330, the mode stirring device rotates the crankshaft 130 in a state where the angle of the antenna connection bar 120 is changed to an angle greater than the default angle, so that the transmission antenna 110 may sequentially move along the path 230.

In operations 310, 320, and 330 may not be performed sequentially, but the order of performance may be changed in a process of the wireless performance measurement, or at least one of operations 310, 320, and 330 may be selectively performed.

Figure 4:
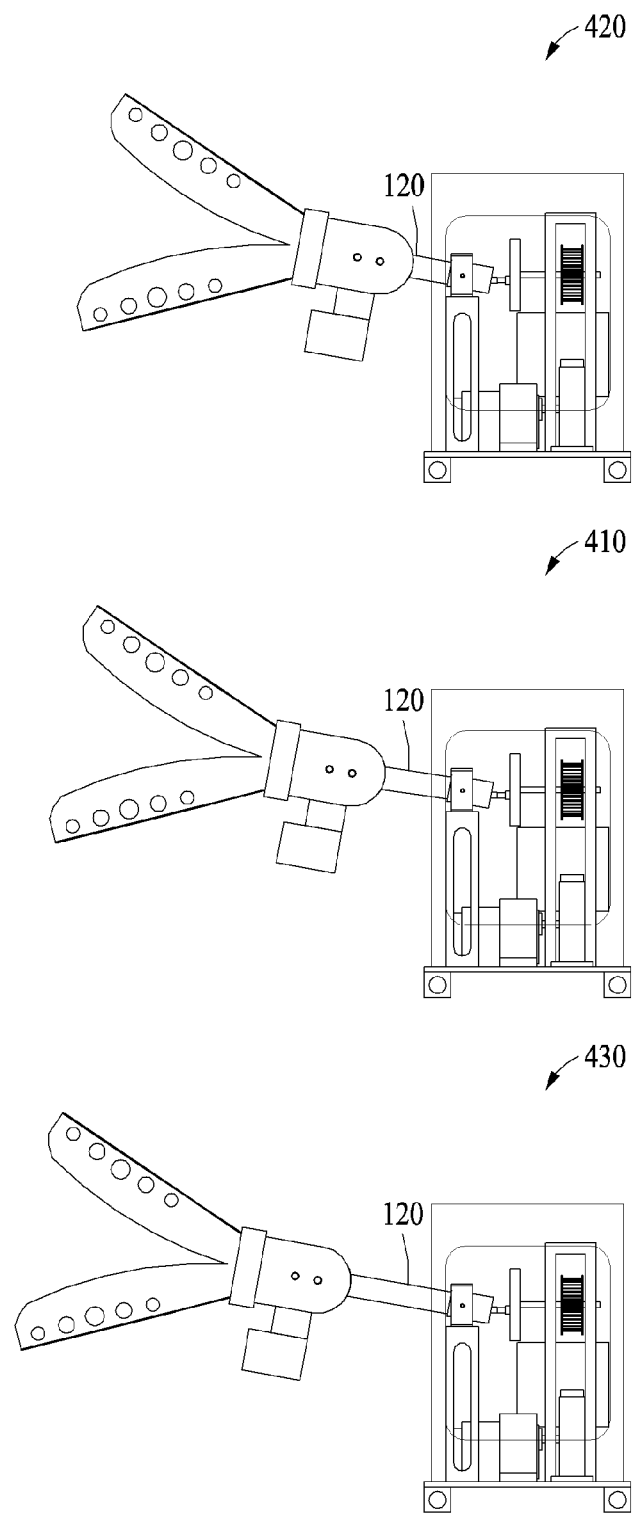
FIG. 4 is a diagram illustrating an example of a length change of an antenna connection bar of a mode stirring device according to an embodiment.

FIG. 4 is a diagram illustrating an example of a length change of an antenna connection bar of a mode stirring device according to an embodiment.

In operation 410, the mode stirring device rotates the crankshaft 130 in a state where the length of the antenna connection bar 120 is a default length, so that the transmission antenna 110 may sequentially move along the path 210.

In operation 420, the mode stirring device rotates the crankshaft 130 in a state where the length of the antenna connection bar 120 is shorter than the default length or the antenna connection bar 120 is replaced with the antenna connection bar 120 shorter than the default length, so that the transmission antenna 110 may sequentially move along the path 220.

In operation 430, the mode stirring device rotates the crankshaft 130 in a state where the length of the antenna connection bar 120 is longer than the default length or the antenna connection bar 120 is replaced with the antenna connection bar 120 longer than the default length, so that the transmission antenna 110 may sequentially move along the path 230.

In operations 410, 420, and 430 are not performed sequentially, but the order of performance may be changed in a process of the wireless performance measurement, or at least one of operations 410, 420, and 430 may be selectively performed.

Figure 5:
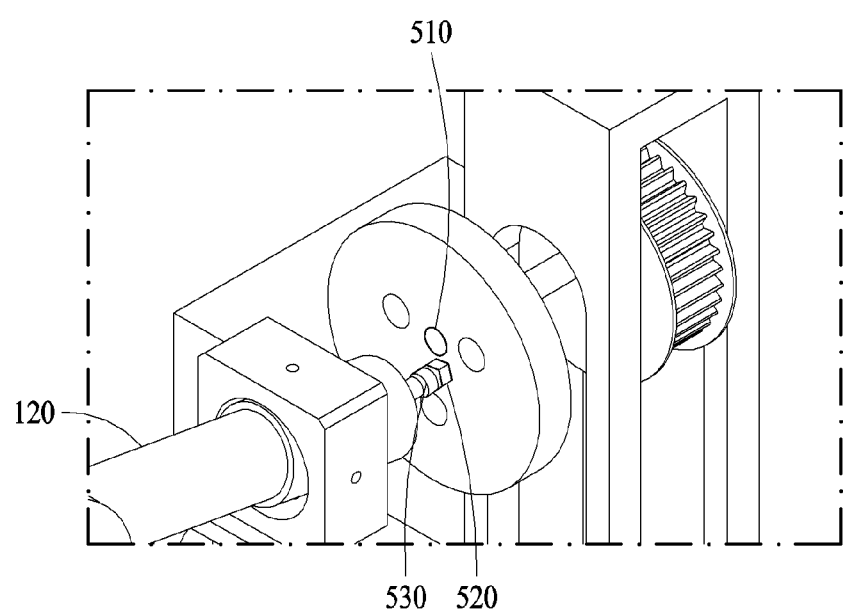
FIG. 5 is an enlarged view illustrating a crankshaft of a mode stirring device according to an embodiment.

FIG. 5 is an enlarged view illustrating a crankshaft of a mode stirring device according to an embodiment.

The crankshaft 130 may include a circular disk connected to the motor 140, an eccentric hole 520, and an eccentric shaft 530 fixable to the eccentric hole and connected to the antenna connection bar 120.

In addition, when the circular disk rotates according to an operation of the motor 140, the eccentric shaft 530 fixed to the eccentric hole 520 of the circular disk rotates, so the antenna connection bar 120 rotates and the conical rotation may be realized.

At this time, as the eccentric shaft 530 is adjusted in the eccentric hole 520, a rotation range of the antenna connection bar 120 may be adjusted by changing the angle of the antenna connection bar 120. That is, as the mode stirring device, it is possible to provide various options that may control the distribution of EM wave modes in the EM wave reverberation chamber.

Figure 6:
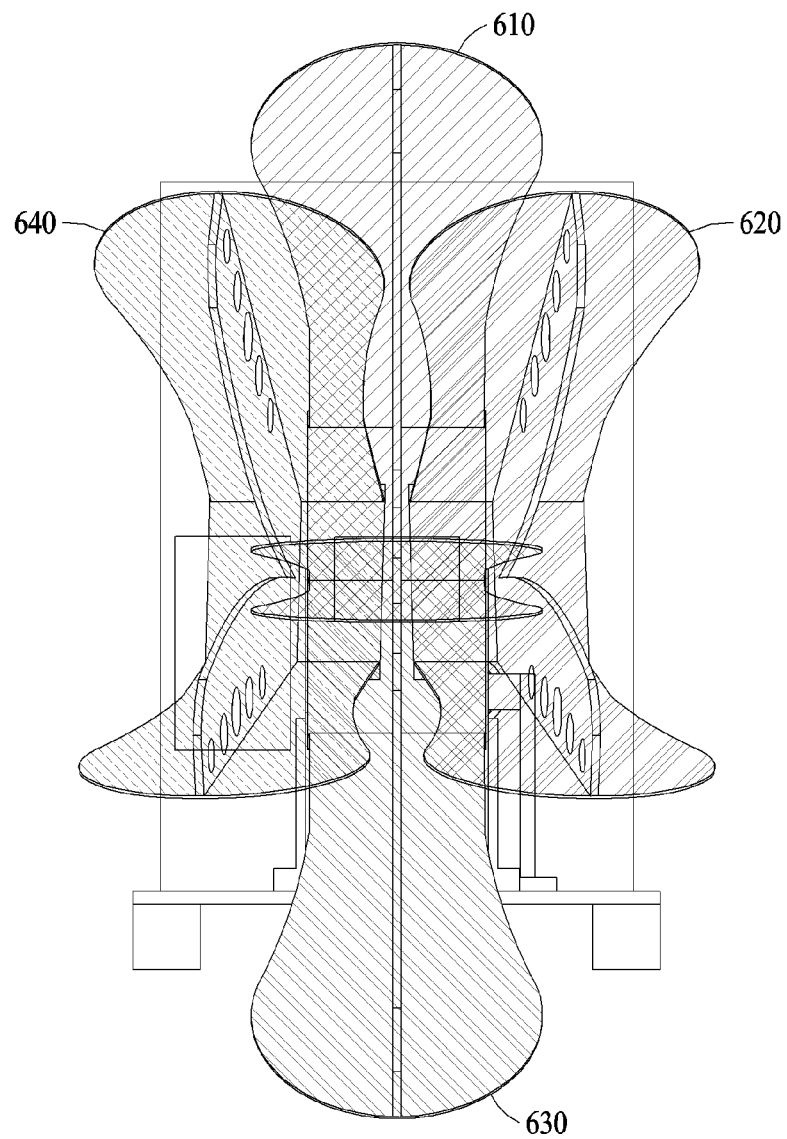
FIG. 6 is a front view illustrating an example of a mode stirring device according to an embodiment.

FIG. 6 is a front view illustrating an example of a mode stirring device according to an embodiment.

In operation 610, the transmission antenna 110 of the mode stirring device moved to position 1 of FIG. 3 may be represented.

In addition, in operation 620, the transmission antenna 110 of the mode stirring device moved to position 2 of FIG. 3 may be represented.

In addition, in operation 630, the transmission antenna 110 of the mode stirring device moved to position 3 of FIG. 3 may be represented.

In addition, in operation 640, the transmission antenna 110 of the mode stirring device moved to position 4 of FIG. 3 may be represented.

Figure 7:
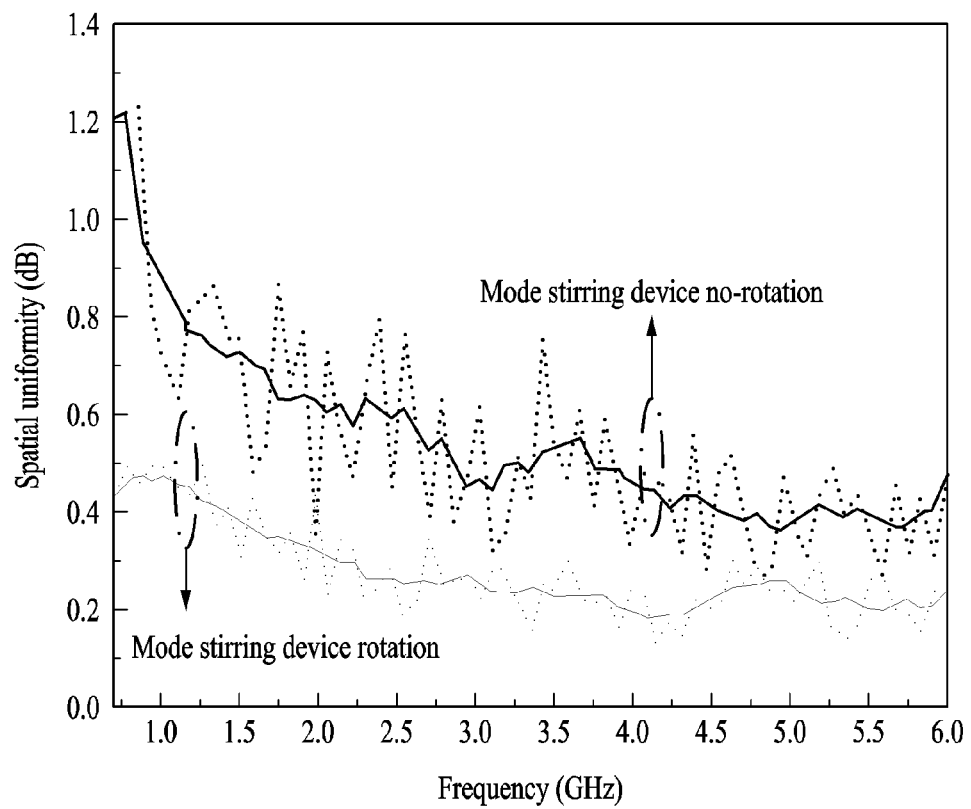
FIG. 7 is a diagram illustrating an example of a wireless performance measurement result according to a mode stirring device operation according to an embodiment.

FIG. 7 shows an example of a wireless performance measurement result (a rotation of the mode stirring device) according to the mode stirring device operation according to an embodiment and an example of a wireless performance measurement result (a no-rotation of the mode stirring device) using a conventional mode stirring device or a mode stirring device without moving the position of the transmission antenna. Also, graph of FIG. 7 may represent a change of spatial uniformity in the frequency band of interest in the test volume of the EM wave reverberation chamber.

As illustrated in FIG. 7, a spatial uniformity value of the wireless performance measurement result (a rotation of the mode stirring device) according to the mode stirring device operation according to an embodiment may decrease by at least 0.10 decibel (dB) and up to 0.78 dB compared to the wireless performance measurement result (a no-rotation of the mode stirring device) without moving the position of the transmission antenna.

In addition, a standard deviation of the wireless performance measurement result (a rotation of the mode stirring device) according to the mode stirring device operation is 0.098 dB and a standard deviation of the wireless performance measurement (a no-rotation of the mode stirring device) using the conventional mode stirring device or the mode stirring device without moving the position of the transmission antenna is 0.221 dB, so deviations between frequencies of the spatial uniformity of the wireless performance measurement result (a rotation of the mode stirring device) according to the mode stirring device operation according to an embodiment may be reduced to about 55% compared to the wireless performance measurement result (a no-rotation of the mode stirring device) using the conventional mode stirring device or the transmission antenna.

This present disclosure provides a mode stirring device that changes a position of a transmission antenna by rotating a crankshaft coupled with the transmission antenna, so spatial uniformity characteristics may be improved in a frequency band of interest in a test volume of the EM wave reverberation chamber and deviations of spatial uniformity values in adjacent measured frequencies may be reduced.

The components described in the embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the embodiments may be implemented by software, and the software may be recorded on a recording medium. The components, the functions, and the processes described in the embodiments may be implemented by a combination of hardware and software.

The method according to embodiments may be written in a computer-executable program and may be implemented as various recording media such as magnetic storage media, optical reading media, or digital storage media.

Various techniques described herein may be implemented in digital electronic circuitry, computer hardware, firmware, software, or combinations thereof. The implementations may be achieved as a computer program product, i.e., a computer program tangibly embodied in an information carrier, e.g., in a machine-readable storage device (for example, a computer-readable medium) or in a propagated signal, for processing by, or to control an operation of, a data processing apparatus, e.g., a programmable processor, a computer, or multiple computers. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or multiple computers at one site or distributed across multiple sites and interconnected by a communication network.

Processors suitable for processing of a computer program include, by way of example, both general and special purpose microprocessors, and any one or more processors of any kind of digital computer. Generally, a processor will receive instructions and data from a read-only memory or a random-access memory, or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Examples of information carriers suitable for embodying computer program instructions and data include semiconductor memory devices, e.g., magnetic media such as hard disks, floppy disks, and magnetic tape, optical media such as compact disk read only memory (CD-ROM) or digital video disks (DVDs), magneto-optical media such as floptical disks, read-only memory (ROM), random-access memory (RAM), flash memory, erasable programmable ROM (EPROM), or electrically erasable programmable ROM (EEPROM). The processor and the memory may be supplemented by, or incorporated in special purpose logic circuitry.

In addition, non-transitory computer-readable media may be any available media that may be accessed by a computer and may include both computer storage media and transmission media.

Although the present specification includes details of a plurality of specific embodiments, the details should not be construed as limiting any invention or a scope that can be claimed, but rather should be construed as being descriptions of features that may be peculiar to specific embodiments of specific inventions. Specific features described in the present specification in the context of individual embodiments may be combined and implemented in a single embodiment. On the contrary, various features described in the context of a single embodiment may be implemented in a plurality of embodiments individually or in any appropriate sub-combination. Furthermore, although features may operate in a specific combination and may be initially depicted as being claimed, one or more features of a claimed combination may be excluded from the combination in some cases, and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In specific cases, multitasking and parallel processing may be advantageous. In addition, it should not be understood that the separation of various device components of the aforementioned embodiments is required for all the embodiments, and it should be understood that the aforementioned program components and apparatuses may be integrated into a single software product or packaged into multiple software products.

The embodiments disclosed in the present specification and the drawings are intended merely to present specific examples in order to aid in understanding of the present disclosure, but are not intended to limit the scope of the present disclosure. It will be apparent to one of ordinary skill in the art that various modifications based on the technical spirit of the present disclosure, as well as the disclosed embodiments, can be made.

What is claimed is:

1. A mode stirring device comprising:
    a transmission antenna configured to output a wireless signal to measure wireless performance in an electromagnetic (EM) wave reverberation chamber;
    an antenna connection bar having one end coupled to a lower end of the transmission antenna;
    a crankshaft connected to another end of the antenna connection bar;
    a motor configured to change a position of the transmission antenna by rotating the crankshaft; and
    a weight coupled to one surface of the lower end of the transmission antenna and configured to prevent the transmission antenna from rotating around the antenna connection bar in a process of changing the position of the transmission antenna by rotating the crankshaft.

2. The mode stirring device of claim 1, further comprising:
    a support configured to fix the mode stirring device to the EM wave reverberation chamber so that a position of the mode stirring device does not change in a process of changing the position of the transmission antenna by rotating the crankshaft.

3. The mode stirring device of claim 1, wherein the crankshaft comprises:
    a circular disk connected to the motor;
    an eccentric hole formed at a center of the circular disk; and
    an eccentric shaft fixable to the eccentric hole and connected to the antenna connection bar.

4. The mode stirring device of claim 1, wherein the antenna connection bar is configured to control a change range of a position where the transmission antenna outputs the wireless signal by changing a length.

5. The mode stirring device of claim 1, wherein the antenna connection bar is configured to control a change range of a position where the transmission antenna outputs the wireless signal by changing a connection angle with the crankshaft.

* * * * *